(12) United States Patent
Chang et al.

(10) Patent No.: US 11,862,551 B2
(45) Date of Patent: Jan. 2, 2024

(54) INTERPOSER AND SEMICONDUCTOR PACKAGE EACH HAVING CONDUCTIVE TERMINALS ON REDISTRIBUTION LAYER WITH DIFFERENT PITCH

(71) Applicants: Global Unichip Corporation, Hsinchu (TW); Taiwan Semiconductor Manufacturing Company, Ltd., Hsinchu (TW)

(72) Inventors: Yu-Ju Chang, Hsinchu (TW); Jia-Liang Chen, Hsinchu (TW); Chun-Hong Chen, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 98 days.

(21) Appl. No.: 17/529,293

(22) Filed: Nov. 18, 2021

(65) Prior Publication Data

US 2023/0117642 A1 Apr. 20, 2023

(30) Foreign Application Priority Data

Oct. 18, 2021 (TW) .................................. 110138468

(51) Int. Cl.
*H01L 23/498* (2006.01)
*H01L 23/538* (2006.01)

(52) U.S. Cl.
CPC .... *H01L 23/49838* (2013.01); *H01L 23/5386* (2013.01); *H01L 23/49816* (2013.01); *H01L 23/49822* (2013.01); *H01L 23/5383* (2013.01)

(58) Field of Classification Search
CPC ........... H01L 23/49838; H01L 23/5386; H01L 23/49816; H01L 23/49822; H01L 23/5383
See application file for complete search history.

(56) References Cited

U.S. PATENT DOCUMENTS

2013/0175686 A1* 7/2013 Meyer ..................... H01L 24/14
257/737
2015/0221573 A1* 8/2015 Paek ..................... H01L 21/568
438/126

(Continued)

FOREIGN PATENT DOCUMENTS

TW   202125789   7/2021
TW   202137349   10/2021

OTHER PUBLICATIONS

"Notice of allowance of Taiwan Counterpart Application", dated Jul. 27, 2022, p. 1-p. 6.

*Primary Examiner* — Michael Jung
(74) *Attorney, Agent, or Firm* — JCIPRNET

(57) ABSTRACT

An interposer, including a redistribution layer structure, first conductive terminals, and second conductive terminals, is provided. The first conductive terminals are disposed on a first surface and are electrically connected to the second conductive terminals. An orthographic projection area of the first conductive terminals on the redistribution layer structure is inside a circuit range outline. There is a first pitch between the adjacent first conductive terminals. The second conductive terminals are disposed on a second surface. An orthographic projection area of a first part of the second conductive terminals on the redistribution layer structure is inside the circuit range outline. An orthographic projection area of a second part of the second conductive terminals on the redistribution layer structure is outside the circuit range outline. There is a second pitch between the adjacent second conductive terminals. The second pitch is greater than the first pitch. A semiconductor package is also provided.

14 Claims, 3 Drawing Sheets

(56) References Cited

U.S. PATENT DOCUMENTS

| | | | |
|---|---|---|---|
| 2019/0229046 A1* | 7/2019 | Tsai | H01L 21/568 |
| 2020/0273785 A1* | 8/2020 | Mok | H01L 25/00 |
| 2021/0265313 A1 | 8/2021 | Chen et al. | |
| 2021/0272929 A1 | 9/2021 | Tsai et al. | |
| 2022/0285328 A1* | 9/2022 | Kim | H01L 23/3128 |
| 2022/0310577 A1* | 9/2022 | Lee | H01L 25/0652 |

\* cited by examiner

INTERPOSER AND SEMICONDUCTOR PACKAGE EACH HAVING CONDUCTIVE TERMINALS ON REDISTRIBUTION LAYER WITH DIFFERENT PITCH

CROSS-REFERENCE TO RELATED APPLICATION

This application claims the priority benefit of Taiwan application serial no. 110138468, filed on Oct. 18, 2021. The entirety of the above-mentioned patent application is hereby incorporated by reference herein and made a part of this specification.

BACKGROUND

Technical Field

The disclosure relates to semiconductor technology, and particularly relates to an interposer and a semiconductor package.

Description of Related Art

The development of semiconductor technology is very fast, especially under the trend of miniaturization of semiconductor chips, the size of semiconductor chips is becoming smaller, so the pitch also becomes smaller. However, in the case where the number of input/output (I/O) terminals on a semiconductor chip remains the same, the degree of fine pitch of a package substrate for mounting the semiconductor chip is limited by the manufacturing process. Therefore, the bonding issue of pitch mismatch between the semiconductor chip and the package substrate will become worse, such that a signal of the semiconductor package cannot be effectively transmitted. Therefore, how to effectively transmit the signal of the semiconductor package has become a major challenge for researchers in the art.

SUMMARY

The disclosure provides an interposer and a semiconductor package, which can effectively transmit a signal of a semiconductor package.

The interposer of the disclosure includes a redistribution layer structure, multiple first conductive terminals, and multiple second conductive terminals. The first conductive terminals are disposed on a first surface. An orthographic projection area of the first conductive terminals on the redistribution layer structure is inside a circuit range outline. There is a first pitch between the adjacent first conductive terminals. The second conductive terminals are disposed on a second surface. An orthographic projection area of a first part of the second conductive terminals on the redistribution layer structure is inside the circuit range outline, and an orthographic projection area of a second part of the second conductive terminals on the redistribution layer structure is outside the circuit range outline. The first conductive terminals are electrically connected to the second conductive terminals. There is a second pitch between the adjacent second conductive terminals. The second pitch is greater than the first pitch, and an orthographic projection area of a part of the second conductive terminal on the redistribution layer structure is outside the circuit range outline.

In an embodiment of the disclosure, the circuit range outline includes a first direction and a second direction perpendicular to each other, and the second part of the second conductive terminals is outside the circuit range outline in the first direction or the second direction.

In an embodiment of the disclosure, the redistribution layer structure is formed with a semiconductor material as a base or the redistribution layer structure is formed with an organic material as a base.

In an embodiment of the disclosure, the first conductive terminals are in a form of micro bumps, and the second conductive terminals are in a form of C4 bumps.

In an embodiment of the disclosure, the first pitch is a minimum pitch between the adjacent first conductive terminals, and the second pitch is a minimum pitch between the adjacent second conductive terminals.

The semiconductor package of the disclosure includes a package substrate, an interposer, and at least one chip. The interposer is disposed on a bearing surface, and the second surface faces the package substrate. The at least one chip is disposed on the first surface. The at least one chip is electrically connected to the package substrate by the interposer.

In an embodiment of the disclosure, the at least one chip is multiple chips, and the chips are arranged side by side on the interposer.

In an embodiment of the disclosure, the semiconductor package is a chip on wafer on substrate or an integrated fan-out package.

In an embodiment of the disclosure, the semiconductor package is used for high-speed signal transmission.

Based on the above, the embodiment enables the second pitch between the adjacent second conductive terminals (close to the package substrate) on the second surface of the redistribution layer structure in the interposer to be greater than the first pitch between the adjacent first conductive terminals (close to the chip) on the first surface of the redistribution layer structure in the interposer by the pitch design of the interposer and the layout of the circuit range outline. In this way, the issue of mismatch between the chip and the package substrate may be improved through converting the pitch of the redistribution layer structure. Contact points with fine pitch configuration on the chip may be converted to contact points with thick pitch configuration on the package substrate, so that the signal of the semiconductor package can be effectively transmitted.

In order for the features and advantages of the disclosure to be more comprehensible, the following specific embodiments are described in detail in conjunction with the accompanying drawings.

DETAILED DESCRIPTION OF DISCLOSED EMBODIMENTS

Figure 1A:
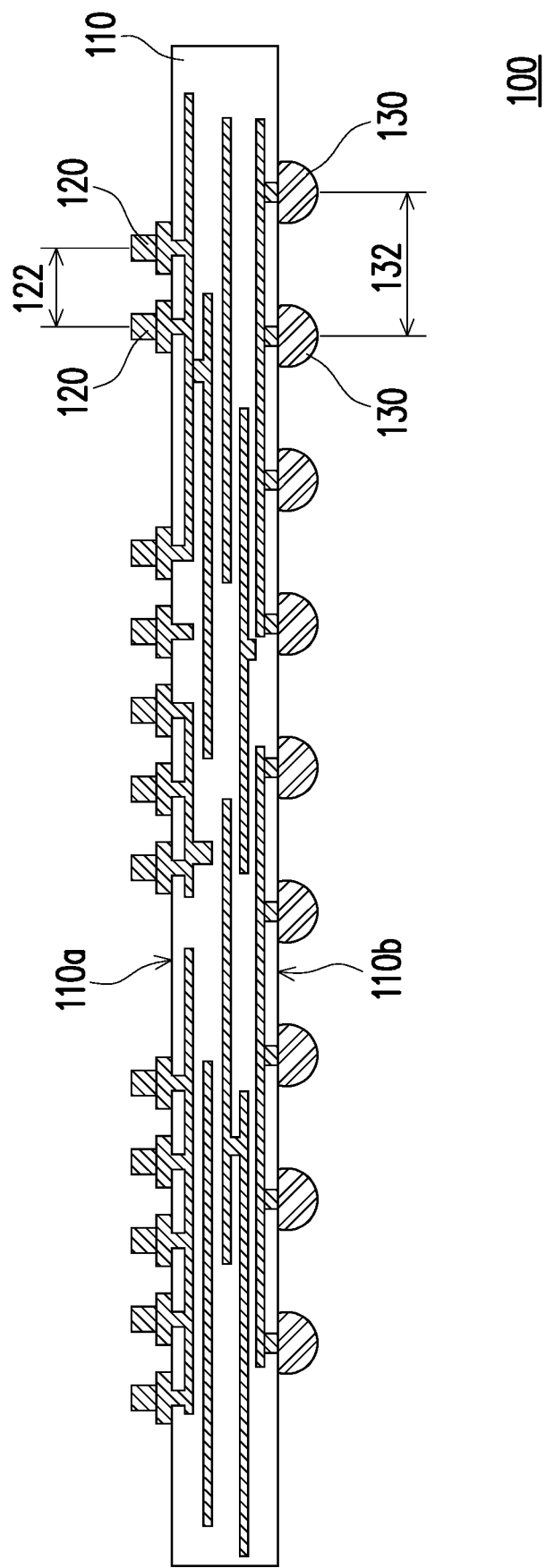
FIG. 1A is a partial cross-sectional schematic view of an interposer according to an embodiment of the disclosure.

The detailed features and advantages of the disclosure are described in detail in the following embodiments. The content is sufficient for persons skilled in the art to understand the technical content of the disclosure to be implemented accordingly. Also, according to the content, claims, and drawings disclosed in the specification, persons skilled in the art may easily understand the relevant objectives and advantages of the disclosure. The following embodiments further illustrate in detail the viewpoints of the disclosure, but do not limit the scope of the disclosure by any viewpoint.

The element sizes in the drawings in the specification are drawn for convenience of description and do not represent the actual ratios of the element sizes.

In the description of the following embodiments, it should be understood that when it is pointed out that a layer (or film) or a structure is disposed "on" or "under" another substrate, another layer (or film), or another structure, the former may be "directly" located on the another substrate, the another layer (or film), or the another structure, or there may be more than one intermediate layer between the two, which are disposed in an "indirect" manner.

In the detailed description of each embodiment, terms such as "first", "second", and "third" may be used to describe different elements. The terms are only used to distinguish between the elements, but in terms of structure, the elements should not be limited by the terms. For example, a first element may be referred to as a second element, and similarly, the second element may be referred to as the first element without departing from the protection scope of the disclosure. In addition, in a manufacturing method, in addition to a specific manufacturing process, the order of forming the elements or components should also not be limited by the terms. For example, the first element may be formed before the second element. Alternatively, the first element may be formed after the second element. Alternatively, the first element and the second element may be formed in the same manufacturing process or step.

Figure 1B:
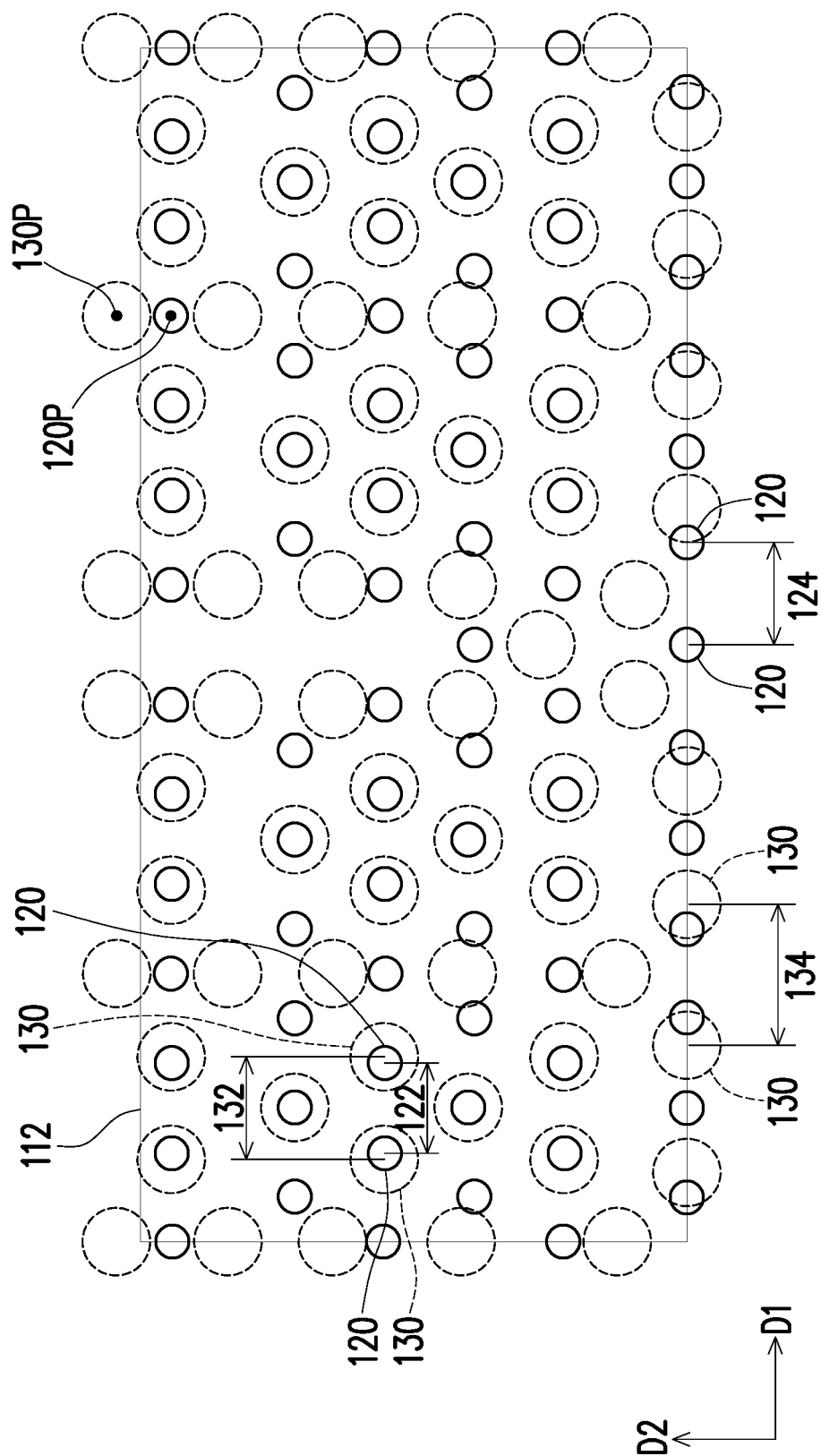
FIG. 1B is a partial top schematic view of FIG. 1A.

FIG. 1A is a partial cross-sectional schematic view of an interposer according to an embodiment of the disclosure. FIG. 1B is a partial top schematic view of FIG. 1A.

Please refer to FIG. 1A and FIG. 1B. In the embodiment, an interposer 100 includes a redistribution layer (RDL) structure 110, multiple first conductive terminals 120, and multiple second conductive terminals 130, wherein the redistribution layer structure 110 includes a circuit range outline 112 (as shown in FIG. 1B) and has a first surface 110a and a second surface 110b opposite to the first surface 110a. Furthermore, the first conductive terminals 120 are disposed on the first surface 110a, and the second conductive terminals 130 are disposed on the second surface 110b. An orthographic projection area of the first conductive terminals 120 on the redistribution layer structure 110 is inside the circuit range outline 112, an orthographic projection area of a first part of the second conductive terminals 130 on the redistribution layer structure 110 is inside the circuit range outline 112, and an orthographic projection area of a second part of the second conductive terminals 130 on the redistribution layer structure 110 is outside the circuit range outline 112, as shown in FIG. 1B. In addition, the first conductive terminals 120 are electrically connected to the second conductive terminals 130. There is a first pitch 122 between the adjacent first conductive terminals 120, there is a second pitch 132 between the adjacent second conductive terminals 130, and the second pitch 132 is greater than the first pitch 122, as shown in FIG. 1A. Therefore, the first conductive terminals 120 may be configured to be bonded with a component with a fine pitch, and the second conductive terminals 130 may be configured to be bonded with a component with a thick pitch. Here, the fine pitch is, for example, less than 135 microns, and the thick pitch is, for example, greater than 150 microns, but the disclosure is not limited thereto. The fine pitch and the thick pitch may be determined according to actual design requirements.

Accordingly, with the pitch design of the interposer 100 and the layout of the circuit range outline, the second pitch 132 between the adjacent second conductive terminals 130 on the second surface 110b of the redistribution layer structure 110 in the interposer 100 is greater than the first pitch 122 between the adjacent first conductive terminals 120 on the first surface 110a of the redistribution layer structure 110 in the interposer 100. In this way, the interposer 110 may be used in a subsequent package structure to become a pitch converting medium between the semiconductor chip and the package substrate, so as to improve the issue of pitch mismatch in the subsequent package structure. Here, the pitch may be defined as a distance between center points of adjacent conductive terminals, and the pitch may be the smallest pitch between the adjacent conductive terminals. For example, as shown in FIG. 1B, the first pitch 122 is the smallest pitch between the adjacent first conductive terminals 120, the second pitch 132 is the smallest pitch between the adjacent second conductive terminals 130, a third pitch 124 is another pitch (greater than the first pitch 122) between the adjacent first conductive terminals 120, and a fourth pitch 134 is another pitch (greater than the second pitch 132) between the adjacent second conductive terminals 130, but the disclosure is not limited thereto. In addition, the implementation of the semiconductor package will be further described in FIG. 2 below.

In some embodiments, the orthographic projection area of the first conductive terminals 120 on the redistribution layer structure 110 being inside the circuit range outline 112 may be that center points 120P of the first conductive terminals 120 are all inside the circuit range outline 112, but the disclosure is not limited thereto.

In some embodiments, in order to reduce the presence of blank regions on the redistribution layer structure 110, improve space utilization, and reduce manufacturing costs, the circuit range outline 112 includes a first direction D1 and a second direction D2 perpendicular to each other, and the second part of the second conductive terminals 130 is outside the circuit range outline 112 in the first direction D1 or the second direction D2, that is, a center point 130P of the second part of the second conductive terminals 130 is outside the circuit range outline 112 in the first direction D1 or the second direction D2, but the disclosure is not limited thereto.

It should be noted that the redistribution layer structure 110 may include multiple other circuit range outlines (not shown) similar to the circuit range outline 112, and the circuit range outline 112 and the other circuit range outlines may be connected in series, so as to improve the flexibility of circuit layout.

In some embodiments, the first conductive terminals 120 are in the form of micro bumps, so the first conductive terminals 120 may be bonded with a chip with micro bumps, and the second conductive terminals 130 are in the form of C4 bumps, so the second conductive terminals 130 may be bonded with a package substrate with C4 bumps, but the disclosure is not limited thereto.

In the embodiment, the first conductive terminals 120 may be electrically connected to the second conductive terminals 130 by a conductive pattern in the redistribution layer structure 110 (as shown by oblique line parts of the redistribution layer structure 110 in FIG. 1A). For example, the redistribution layer structure 110 is formed with a semiconductor material as a base, and the redistribution layer structure 110 may include the conductive pattern (as shown by the oblique line parts of the redistribution layer structure 110 in FIG. 1A) and a base part (as shown by blank parts of the redistribution layer structure 110 in FIG. 1A, wherein the semiconductor material may include silicon, and the material of the conductive pattern may include copper, gold, nickel, aluminum, platinum, tin, a combination thereof, an alloy thereof, or other suitable conductive materials, but the disclosure is not limited thereto. In an embodiment not shown, the redistribution layer structure 110 is formed with an organic material as the base. For example, the redistribution layer structure 110 may include the conductive pattern and a dielectric layer, wherein the material of the dielectric layer may include polyimide (PI), benzocyclobutene (BCB), polybenzoxazole (PBO), or other suitable organic dielectric materials, and the material of the conductive pattern may include copper, gold, nickel, aluminum, platinum, tin, a combination thereof, an alloy thereof, or other suitable conductive materials, but the disclosure is not limited thereto.

It should be noted that the disclosure does not limit the implementation of the redistribution layer structure 110, as long as the first conductive terminals 120 may be electrically connected to the second conductive terminals 130 by the redistribution layer structure 110, the redistribution layer structure 110 belongs to the protection scope of the disclosure. In addition, the conductive pattern of the redistribution layer structure 110 in FIG. 1A is only schematically drawn and is not an actual electrical connection manner of the disclosure. The actual electrical connection manner of the disclosure may be determined according to design requirements.

It must be noted here that the following embodiment continues to use the reference numerals and some content of the above embodiment, wherein the same or similar reference numerals are adopted to represent the same or similar elements, and the description of the same technical content is omitted. For the description of the omitted parts, reference may be made to the above embodiment, which will not be repeated in the following embodiment.

Figure 2:
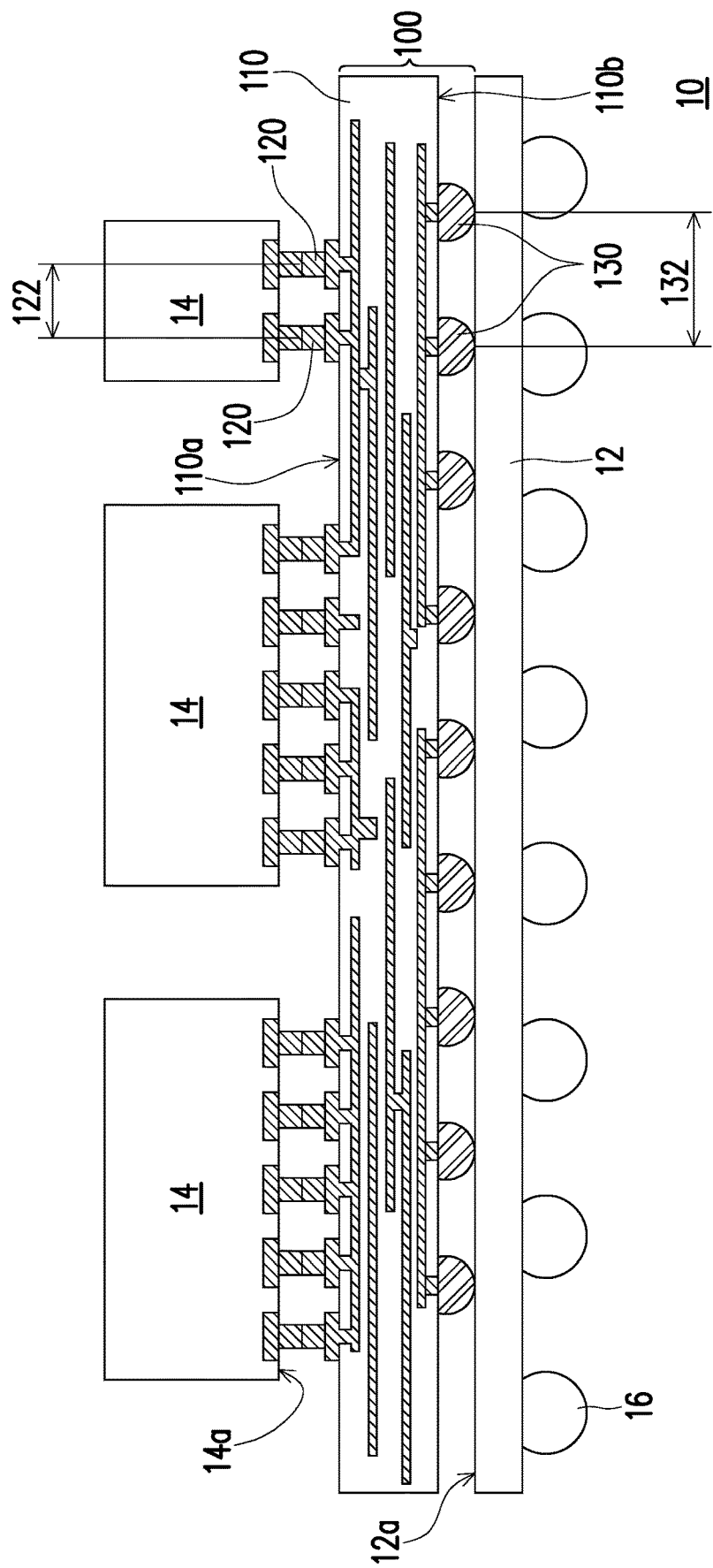
FIG. 2 is a partial cross-sectional schematic view of a semiconductor package according to an embodiment of the disclosure.

FIG. 2 is a partial cross-sectional schematic view of a semiconductor package according to an embodiment of the disclosure. Please refer to FIG. 2. A semiconductor package 10 of the embodiment may be a chip on wafer on substrate (CoWoS), but the disclosure is not limited thereto. In an embodiment not shown, the semiconductor package may also be an integrated fan-out (InFO) package.

In the embodiment, the semiconductor package 10 includes a package substrate 12, an interposer 100, and at least one chip 14 (schematically shown as three). Here, the package substrate 12 may be a printed circuit board (PCB) or other suitable substrate types, and the chip 14 may be a system on chip (SoC) or other suitable chip types, which are not limited in the disclosure.

Furthermore, the package substrate 12 has a bearing surface 12a. The interposer 100 is disposed on the bearing surface 12a with the second surface 110b facing the package substrate 12. The chip 14 is disposed on the first surface 110a with an active surface 14a, and multiple chips 14 may be arranged side by side on the interposer 100. In addition, the chip 14 is electrically connected to the package substrate 12 by the interposer 100. Accordingly, the embodiment enables the second pitch 132 between the adjacent second conductive terminals 130 (close to the package substrate 12) on the second surface 110b of the redistribution layer structure 110 in the interposer 100 to be greater than the first pitch 122 between the adjacent first conductive terminals 120 (close to the chip 14) on the first surface 110a of the redistribution layer structure 110 in the interposer 100 by the pitch design of the interposer 100 and the layout of the circuit range outline. In this way, the issue of mismatch between the chip 14 and the package substrate 12 may be improved through converting the pitch of the redistribution layer structure 110. Contact points with fine pitch configuration on the chip 14 may be converted to contact points with thick pitch configuration on the package substrate 12, so that a signal of the semiconductor package 10 can be effectively transmitted. Here, the circuit range outline 112 on the redistribution layer structure 110 shown in FIG. 1B may correspond to an element functional block (IP macro) range on the chip 14, that is, multiple element functional block ranges on the chip 14 may respectively correspond to multiple circuit range outlines 112, but the disclosure is not limited thereto.

In some embodiments, since a high-speed signal transmission chip end has higher requirements for input/output terminals to transmit more signals, but requirements for a ground signal, etc. at a package substrate end are still limited by the manufacturing process, the semiconductor package 10 of the embodiment may be used for high-speed signal transmission, and the design of the interposer 100 enables the semiconductor package to meet different requirements at the two ends at the same time, but the disclosure is not limited thereto. Here, the first conductive terminals 120 and the second conductive terminals 130 in the interposer 100 may be designed into any suitable terminals, such as power ground terminals, according to actual design requirements, and the number ratio may also be adjusted according to actual design requirements.

In some embodiments, multiple third conductive terminals 16 may be optionally disposed on the surface of the package substrate 12 opposite to the interposer 100, so that the semiconductor package 10 may be further connected to other components, but the disclosure is not limited thereto.

In summary, the embodiment enables the second pitch between the adjacent second conductive terminals (close to the package substrate) on the second surface of the redistribution layer structure in the interposer to be greater than the first pitch between the adjacent first conductive terminals (close to the chip) on the first surface of the redistribution layer structure in the interposer by the pitch design of the interposer and the layout of the circuit range outline. In this way, the issue of mismatch between the chip and the package substrate may be improved through converting the pitch of the redistribution layer structure. Contact points with fine pitch configuration on the chip may be converted to contact points with thick pitch configuration on the package substrate, so that the signal of the semiconductor package can be effectively transmitted.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. An interposer for disposing at least one chip, comprising:
a redistribution layer structure, comprising a circuit range outline comprising a first direction and a second direction perpendicular to each other and having a first surface and a second surface opposite to the first surface, wherein the circuit range outline corresponds to an element functional block range on the at least one chip and the circuit range outline is a vertical projection plane along a third direction orthogonal to the first direction and the second direction;

a plurality of first conductive terminals, disposed on the first surface, wherein an orthographic projection area of the first conductive terminals on the redistribution layer structure is inside the circuit range outline, and there is a first pitch between the adjacent first conductive terminals; and a plurality of second conductive terminals, disposed on the second surface, wherein an orthographic projection area of a first part of the second conductive terminals on the redistribution layer structure is inside the circuit range outline, portion of an orthographic projection area of a second part of the second conductive terminals on the redistribution layer structure is outside the circuit range outline, another portion of the orthographic projection area of the second part of the second conductive terminals on the redistribution layer structure is inside the circuit range outline, a center point of the second part of the second conductive terminals is outside the circuit range outline, the first conductive terminals are electrically connected to the second conductive terminals, there is a second pitch between the adjacent second conductive terminals, the second pitch is greater than the first pitch, there is a third pitch between another adjacent first conductive terminals, there is a fourth pitch between another adjacent second conductive terminals, the first pitch is different from the third pitch, and the second pitch is different from the fourth pitch.

2. The interposer according to claim 1, wherein the second part of the second conductive terminals is outside the circuit range outline in the first direction or the second direction.

3. The interposer according to claim 1, wherein the redistribution layer structure is formed with a semiconductor material as a base.

4. The interposer according to claim 1, wherein the redistribution layer structure is formed with an organic material as a base.

5. The interposer according to claim 1, wherein the first conductive terminals are in a form of micro bumps, and the second conductive terminals are in a form of C4 bumps.

6. The interposer according to claim 1, wherein the first pitch is a smallest pitch between the adjacent first conductive terminals, and the second pitch is a smallest pitch between the adjacent second conductive terminals.

7. A semiconductor package, comprising:
a package substrate, having a bearing surface;
the interposer according to claim 1, disposed on the bearing surface, wherein the second surface faces the package substrate; and
at least one chip, having an active surface and disposed on the first surface with the active surface, wherein the at least one chip is electrically connected to the package substrate by the interposer.

8. The semiconductor package according to claim 7, wherein the at least one chip is a plurality of chips, and the chips are arranged side by side on the interposer.

9. The semiconductor package according to claim 7, wherein the semiconductor package is a chip on wafer on substrate or an integrated fan-out package.

10. The semiconductor package according to claim 7, wherein the second part of the second conductive terminals is outside the circuit range outline in the first direction or the second direction.

11. The semiconductor package according to claim 7, wherein the redistribution layer structure is formed with a semiconductor material as a base.

12. The semiconductor package according to claim 7, wherein the redistribution layer structure is formed with an organic material as a base.

13. The semiconductor package according to claim 7, wherein the first conductive terminals are in a form of micro bumps, and the second conductive terminals are in a form of C4 bumps.

14. The semiconductor package according to claim 7, wherein the first pitch is a smallest pitch between the adjacent first conductive terminals, and the second pitch is a smallest pitch between the adjacent second conductive terminals.

* * * * *